United States Patent
Yuan et al.

(10) Patent No.: US 10,818,239 B2
(45) Date of Patent: Oct. 27, 2020

(54) PIXEL DRIVING CIRCUIT AND METHOD FOR DRIVING THE SAME, PIXEL UNIT AND DISPLAY PANEL

(71) Applicant: BOE TECHNOLOGY GROUP CO., LTD., Beijing (CN)

(72) Inventors: Lijun Yuan, Beijing (CN); Guangliang Shang, Beijing (CN); Xing Yao, Beijing (CN); Haoliang Zheng, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,612

(22) Filed: Apr. 30, 2019

(65) Prior Publication Data

US 2020/0082757 A1    Mar. 12, 2020

(30) Foreign Application Priority Data

Sep. 10, 2018    (CN) .......................... 2018 1 1052496

(51) Int. Cl.
*G09G 3/3258*    (2016.01)
*G09G 3/3233*    (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3233; G09G 3/3266; G09G 3/3291; G09G 2300/0426;
(Continued)

(56) References Cited

U.S. PATENT DOCUMENTS 9,269,293 B2    2/2016   Kim
2013/0335397 A1   12/2013   Kim

FOREIGN PATENT DOCUMENTS

CN    104485071 A    4/2015
CN    103489394 B    5/2017
(Continued)

OTHER PUBLICATIONS

Office Action issued in corresponding Chinese Patent Application No. 201811052496.1, dated Nov. 5, 2019.

*Primary Examiner* — Stacy Khoo
(74) *Attorney, Agent, or Firm* — McDermott Will & Emery LLP

(57) ABSTRACT

The present disclosure provides a pixel driving circuit and a method for driving the same, a pixel unit, and a display panel. The pixel circuit includes: a driving sub-circuit, configured to generate driving current based on a data signal and a first voltage; a first light-emitting control sub-circuit configured to receive a first control signal and the first voltage, and provide the first voltage to the driving sub-circuit under control of the first control signal; a second light-emitting control sub-circuit configured to receive a second control signal and provide driving current generated by the driving sub-circuit to an output terminal of the pixel driving circuit under control of the second control signal; a driving control sub-circuit configured to receive the second control signal and the data signal and provide the data signal to the driving sub-circuit under control of the second control signal; and a reset sub-circuit configured to receive a reset signal and a second voltage, and reset the driving sub-circuit using the second voltage under control of the reset signal.

20 Claims, 12 Drawing Sheets

(51) Int. Cl.
  *G09G 3/3266*   (2016.01)
  *G09G 3/3291*   (2016.01)
  *H01L 27/32*    (2006.01)

(52) U.S. Cl.
  CPC ....... *G09G 3/3291* (2013.01); *H01L 27/3276* (2013.01); *G09G 2300/0426* (2013.01); *G09G 2300/0439* (2013.01); *G09G 2300/0809* (2013.01)

(58) Field of Classification Search
  CPC .... G09G 2300/0439; G09G 2300/0809; H01L 27/3276
  See application file for complete search history.

(56) References Cited

FOREIGN PATENT DOCUMENTS

| | | |
|---|---|---|
| CN | 104678621 B | 9/2017 |
| CN | 107221289 A | 9/2017 |

PIXEL DRIVING CIRCUIT AND METHOD FOR DRIVING THE SAME, PIXEL UNIT AND DISPLAY PANEL

CROSS-REFERENCE TO RELATED APPLICATION(S)

The present application claims priority to the Chinese Patent Application 201811052496.1, filed on Sep. 10, 2018, which is incorporated herein by reference in its entirety.

TECHNICAL FIELD

The present disclosure relates to the field of display technology, and more particularly, to a pixel driving circuit and a method for driving the same, a pixel unit, and a display panel.

BACKGROUND

In a pixel driving circuit of an Active Matrix Organic Light Emitting Diode (AMOLED) display apparatus, since Excimer Laser Annealing (ELA) and doping processes used for manufacturing Thin Film Transistors (TFTs) in an AMOLED display screen in practical production may not ensure good uniformity of the TFTs, there is a shift phenomenon for a threshold voltage of a driving transistor. For example, for a basic 2T1C (two thin film transistors and one capacitor) pixel driving circuit in the AMOLED display screen, when the same data signal (Data) is written therein, a shift of a threshold voltage affects driving current of light-emitting elements, thereby causing non-uniform brightness of various pixels.

SUMMARY

The embodiments of the present disclosure propose a pixel driving circuit and a method for driving the same, a pixel unit, and a display panel.

According to an aspect of the embodiments of the present disclosure, there is proposed a pixel driving circuit. The pixel driving circuit comprises:

a driving sub-circuit, configured to generate driving current based on a data signal and a first voltage;

a first light-emitting control sub-circuit configured to receive a first control signal and the first voltage, and provide the first voltage to the driving sub-circuit under control of the first control signal;

a second light-emitting control sub-circuit configured to receive a second control signal and provide driving current generated by the driving sub-circuit to an output terminal of the pixel driving circuit under control of the second control signal;

a driving control sub-circuit configured to receive the second control signal and the data signal and provide the data signal to the driving sub-circuit under control of the second control signal; and a reset sub-circuit configured to receive a reset signal and a second voltage, and reset the driving sub-circuit using the second voltage under control of the reset signal.

In an example, the driving sub-circuit comprises a driving transistor, a first transistor, and a storage capacitor, wherein the driving transistor has a gate connected to the storage capacitor at a second node, a first electrode connected to the first light-emitting control sub-circuit and the driving control sub-circuit at a first node, and a second electrode connected to the second light-emitting control sub-circuit and the reset sub-circuit at a third node, the first transistor has a gate connected to receive the first control signal, a first electrode connected to the second node, and a second electrode connected to the third node; and the storage capacitor has a first terminal connected to a first voltage line for providing the first voltage, and a second terminal connected to the second node.

In an example, the first transistor is an N-type transistor, and the driving transistor is a P-type transistor.

In an example, the first light-emitting control sub-circuit comprises a second transistor having a gate connected to receive the first control signal, a first electrode connected to the first voltage line, and a second electrode connected to the first node.

In an example, the second transistor is a P-type transistor.

In an example, the second light-emitting control sub-circuit comprises a third transistor having a gate connected to receive the second control signal, a first electrode connected to the third node, and a second electrode connected to the output terminal.

In an example, the third transistor is an N-type transistor.

In an example, the driving control sub-circuit comprises a fourth transistor having a gate connected to receive the second control signal, a first electrode connected to a data signal terminal for providing the data signal, and a second electrode connected to the first node.

In an example, the fourth transistor is a P-type transistor.

In an example, the reset sub-circuit comprises a fifth transistor having a gate connected to receive the reset signal, a first electrode connected to a second voltage line for providing the second voltage, and a second electrode connected to the third node.

In an example, the fifth transistor is a P-type transistor.

In an example, the reset sub-circuit comprises a fifth transistor having a gate connected to receive the reset signal, a first electrode connected to the second voltage line for providing the second voltage, and a second electrode connected to the second node.

In an example, the fifth transistor is a P-type transistor.

According to another aspect of the embodiments of the present disclosure, there is proposed a pixel unit, comprising:

the pixel driving circuit described above; and a light-emitting element having an input terminal connected to the output terminal of the pixel driving circuit.

According to yet another aspect of the embodiments of the present disclosure, there is proposed a display panel, comprising a plurality of pixel units described above.

In an example, the plurality of pixel units are arranged in an array, the display panel further comprising:

a plurality of scanning lines, wherein each of the plurality of scanning lines is connected to a respective row of pixel units in the array to provide a second control signal to the row of pixel units;

a plurality of data lines, wherein each of the plurality of data lines is connected to a respective column of pixel units in the array to provide a data signal to the column of pixel units; and a plurality of light-emitting control lines, wherein each of the plurality of light-emitting control lines is connected to a respective row of pixel units in the array to provide a first control signal to the row of pixel units.

In an example, a reset signal received by an $n^{th}$ row of pixel units is provided by a scanning line connected to an $(n-1)^{th}$ row of pixel units, wherein n is an integer and 2≤n≤N, and N represents a number of rows of pixel units in the array.

According to a further aspect of the embodiments of the present disclosure, there is proposed a method for driving the pixel driving circuit described above, comprising:

providing, in a first period, a reset signal at a second level to the pixel driving circuit, so that the reset sub-circuit of the pixel driving circuit resets the driving sub-circuit;

providing, in a second period, a second control signal at the second level to the pixel driving circuit, so that the driving control sub-circuit of the pixel driving circuit provides a received data signal to the driving sub-circuit; and providing, in a third period, a first control signal at the second level and a second control signal at a first level to the pixel driving circuit, so that the first light-emitting control sub-circuit of the pixel driving circuit provides a received first voltage to the driving sub-circuit of the pixel driving circuit, the driving sub-circuit generates driving current based on the data signal and the first voltage, and the second light-emitting control sub-circuit of the pixel driving circuit provides the driving current generated by the driving sub-circuit to the output terminal of the pixel driving circuit.

In an example, the driving sub-circuit comprises a driving transistor, a first transistor, and a storage capacitor, wherein the first light-emitting control sub-circuit comprises a second transistor, the second light-emitting control sub-circuit comprises a third transistor, the driving control sub-circuit comprises a fourth transistor, and the reset sub-circuit comprises a fifth transistor, wherein in the first period, the first control signal and the second control signal having the first level are provided, and the reset signal having the second level is provided;

in the second period, the first control signal and the reset signal having the first level are provided, and the second control signal having the second level is provided; and in the third period, the second control signal and the reset signal having the first level are provided, and the first control signal having the second level is provided.

In an example, the first transistor and the third transistor are N-type transistors, the driving transistor, the second transistor, the fourth transistor, and the fifth transistor are P-type transistors, the first level is a high level and the second level is a low level.

BRIEF DESCRIPTION OF THE DRAWINGS

In order to more clearly illustrate the technical solutions in the embodiments of the present disclosure or in the related art, the accompanying drawings required to be used in the description of the embodiments will be briefly described below. Obviously, the accompanying drawings in the following description are only some embodiments of the present disclosure, and those skilled in the art may obtain other accompanying drawings according to these accompanying drawings without any creative work. In the accompanying drawings.

DETAILED DESCRIPTION

Figure 1:
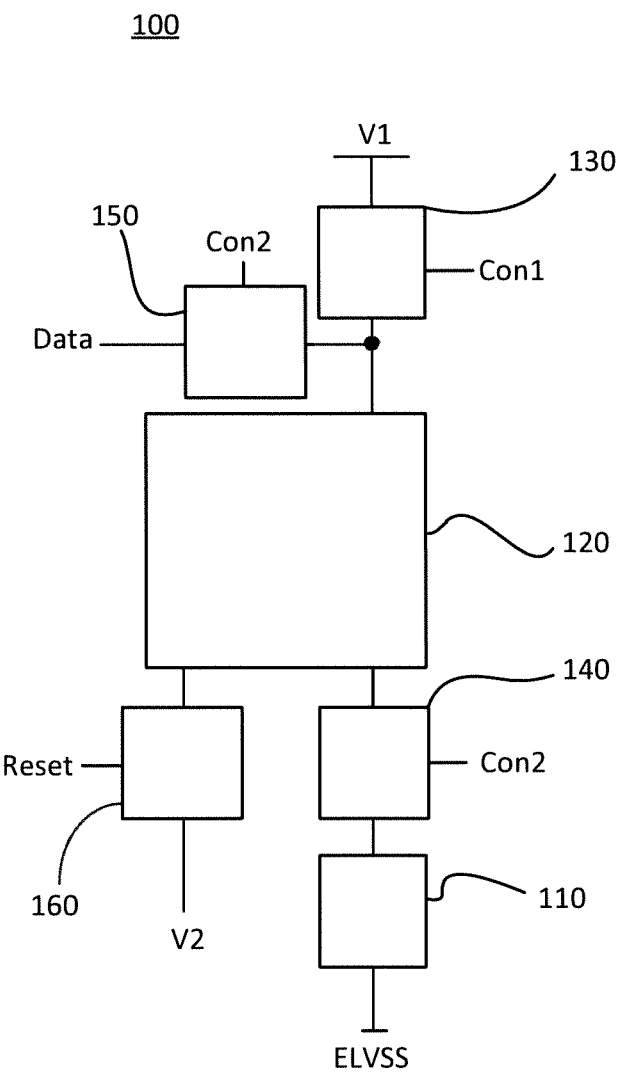
FIG. 1 illustrates a schematic block diagram of a pixel unit according to an embodiment of the present disclosure.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "connected" may mean that two components are directly connected, or that two components are connected via one or more other components. In addition, the two components can be connected or coupled by wire or wirelessly.

The transistors used in the embodiments of the present disclosure may each be a thin film transistor or a field effect transistor or other devices having the same characteristics. According to functions of the transistors in a circuit, the transistors used in the embodiments of the present disclosure are primarily switch transistors. Since a source and a drain of the thin film transistor used herein are symmetrical, the source and the drain thereof may be interchanged. In the embodiments of the present disclosure, one of the source or the drain is referred to as a first electrode, and the other of the source or the drain is referred to as a second electrode. In the following examples, the description is made by taking the driving transistor being a P-type thin film transistor as an example, and other transistors may have the same type as or different type from that of the driving transistor according to a design of the circuit. Similarly, in other embodiments, the driving transistor may also be illustrated as an N-type thin film transistor. It may be understood by those skilled in the art that the technical solutions according to the present disclosure may also be implemented by correspondingly changing the types of the other transistors and inverting various driving signals and level signals (and/or making some other additional adaptive amendments).

In addition, in the description of the embodiments of the present disclosure, the terms "first level" and "second level" are only used to distinguish magnitudes of the two levels from each other. In some embodiments, "first level" may be an inactive level for causing a related transistor to be turned off, and "second level" may be an active level for causing a related transistor to be turned on. Hereinafter, since a P-type thin film transistor is used as an example of the driving transistor, "first level" may, for example, be a high level, and "second level" may, for example, be a low level.

The present disclosure will be described in detail below with reference to the accompanying drawings.

The embodiments of the present disclosure provide a pixel driving circuit and a method for driving the same, a pixel unit, and a display panel. According to the embodiments of the present disclosure, a threshold voltage of a driving transistor may be compensated while reducing a number of transistors in the pixel circuit as much as possible, which facilitates the improvement in resolution.

FIG. 1 illustrates a schematic block diagram of a pixel unit 100 according to an embodiment of the present disclosure.

As shown in FIG. 1, the pixel unit 100 may comprise a light-emitting element 110 and a pixel driving circuit for driving the light-emitting element 110 to emit light. In FIG. 1, the pixel driving circuit comprises a driving sub-circuit 120, a first light-emitting control sub-circuit 130, a second light-emitting control sub-circuit 140, a driving control sub-circuit 150, and a reset sub-circuit 160.

The light-emitting element 110 may be any light-emitting element which is driven by current, such as an OLED or AMOLED light-emitting unit. The light-emitting element 110 has a first terminal (input terminal) and a second terminal (output terminal), wherein the first terminal is connected to an output terminal of the pixel driving circuit to receive driving current from the pixel driving circuit, and the second terminal is connected to a reference voltage terminal ELVSS. In some embodiments, the first terminal is an anode of the light-emitting element 110 and the second terminal is a cathode of the light-emitting element 110.

The driving sub-circuit 120 generates the driving current for causing the light-emitting element 110 to emit light.

The first light-emitting control sub-circuit 130 is connected between a first voltage line and the driving sub-circuit 120, and is configured to receive a first control signal Con1, and receive, under control of the first control signal Con1, a first voltage V1 from the first voltage line and transmit the first voltage V1 to the driving sub-circuit 120. In some embodiments, the first voltage V1 may be a power supply voltage ELVDD. In some embodiments, the power supply voltage ELVDD is higher than a first level (i.e., a high level).

The second light-emitting control sub-circuit 140 is connected between the driving sub-circuit 120 and the output terminal of the pixel driving circuit, and is configured to receive a second control signal Con2, and provide, under control of the second control signal Con2, the current (the driving current) generated by the driving sub-circuit 120 for causing the light-emitting element 110 to emit light, to the output terminal of the pixel driving circuit. Thereby, the driving current is provided to the first terminal of the light-emitting element 110.

In some embodiments, the second control signal Con2 is different from the first control signal Con1.

The driving control sub-circuit 150 is connected between a data line and the driving sub-circuit 120, and is configured to receive the second control signal Con2, and provide a data signal Data from the data line to the driving sub-circuit 120 under control of the second control signal Con2. In some embodiments, the data signal Data is a voltage signal, and magnitude of the driving current is related to a voltage of the data signal Data.

In some embodiments, the driving control sub-circuit 150 and the first light-emitting control sub-circuit 130 are connected to the driving sub-circuit 120 at a first node N1.

The reset sub-circuit 160 is connected between a second voltage line and the driving sub-circuit 120, and is configured to receive a reset signal Reset, and reset, under control of the reset signal Reset, the driving sub-circuit 120 (for example, voltages at a second node N2 and a third node N3) using a second voltage V2 from the second voltage line. In some embodiments, the second voltage V2 may be a second level (a low level).

Figure 2:
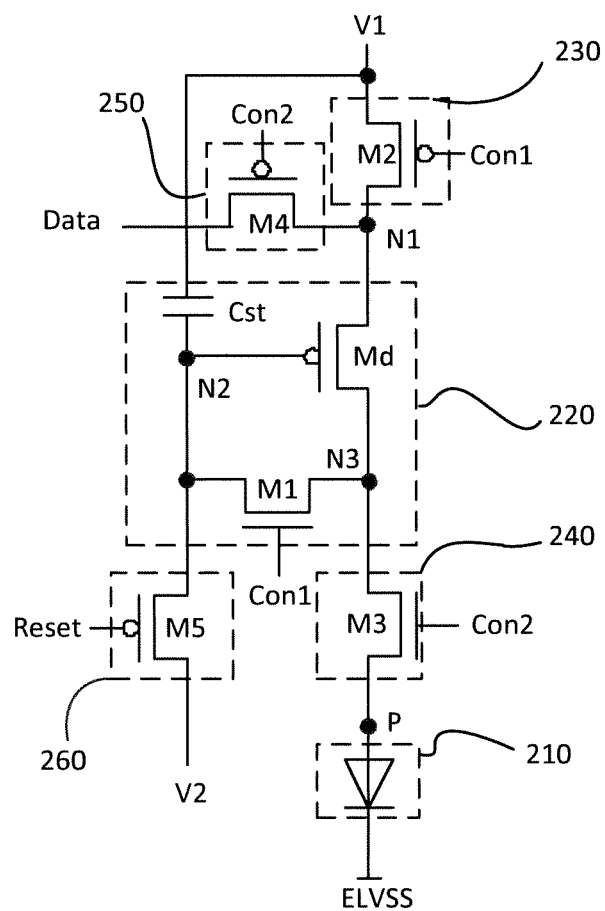
FIG. 2 illustrates a circuit diagram of a pixel driving circuit according to an embodiment of the present disclosure.

FIG. 2 illustrates a circuit diagram of a pixel driving circuit according to an embodiment of the present disclosure. Similarly to FIG. 1, the pixel driving circuit of FIG. 2 comprises a driving sub-circuit 220, a first light-emitting control sub-circuit 230, a second light-emitting control sub-circuit 240, a driving control sub-circuit 250, and a reset sub-circuit 260. An output terminal P of the pixel driving circuit is connected to a light-emitting element 210, and driving current generated by the pixel driving circuit is provided to the light-emitting element 210 to drive the light-emitting element 210 to emit light. In FIG. 2, the light-emitting element 210 is an OLED light-emitting unit.

As shown in FIG. 2, the driving sub-circuit 220 comprises a driving transistor Md, a first transistor M1, and a storage capacitor Cst.

The driving transistor Md has a gate connected to a second node N2, a first electrode connected to the first light-emitting control sub-circuit 230 at a first node N1, and a second electrode connected to the second light-emitting control sub-circuit 240 at a third node N3.

The first transistor M1 has a gate configured to receive a first control signal Con1, a first electrode connected to the second node N2, and a second electrode connected to the third node N3.

The storage capacitor Cst has a first terminal connected to a first voltage line to receive a first voltage V1, and a second terminal connected to the second node N2.

The first transistor M1 and the driving transistor Md are different types of transistors. Specifically, in the present exemplary embodiment, the driving transistor Md is a P-type transistor, the first transistor M1 is an N-type transistor, the first electrode of the driving transistor Md is a source, and the second electrode of the driving transistor Md is a drain.

The first light-emitting control sub-circuit 230 comprises a second transistor M2, and the second light-emitting control sub-circuit 240 comprises a third transistor M3.

Specifically, the second transistor M2 has a gate configured to receive the first control signal Con1, a first electrode connected to the first voltage line to receive the first voltage V1, and a second electrode connected to the first node N1.

The third transistor M3 has a gate configured to receive a second control signal Con2, a first electrode connected to the third node N3, and a second electrode connected to the output terminal P of the pixel driving circuit, and thus to a first terminal of the light-emitting element 210. A second terminal of the light-emitting element 210 is connected to a reference voltage terminal ELVSS for providing a reference voltage.

The second transistor M2 and the driving transistor Md are the same type of transistors, and the third transistor M3 and the driving transistor Md are different types of transistors. In the present exemplary embodiment, the second transistor M2 is a P-type transistor, and the third transistor M3 is an N-type transistor.

The driving control sub-circuit 250 comprises a fourth transistor M4.

The fourth transistor M4 has a gate configured to receive the second control signal Con2, a first electrode connected to a data line to receive a data signal Data, and a second electrode connected to the second node N2.

The fourth transistor M4 and the driving transistor Md are the same type of transistors. In the present exemplary embodiment, the fourth transistor M4 is a P-type transistor.

The reset sub-circuit 260 comprises a fifth transistor M5.

The fifth transistor M5 has a gate configured to receive a reset signal Reset, a first electrode connected to a second voltage line to receive a second voltage V2, and a second electrode connected to the second node N2.

The fifth transistor M5 and the driving transistor Md are the same type of transistors. In the present exemplary embodiment, the fifth transistor M5 is a P-type transistor.

Figure 3A:
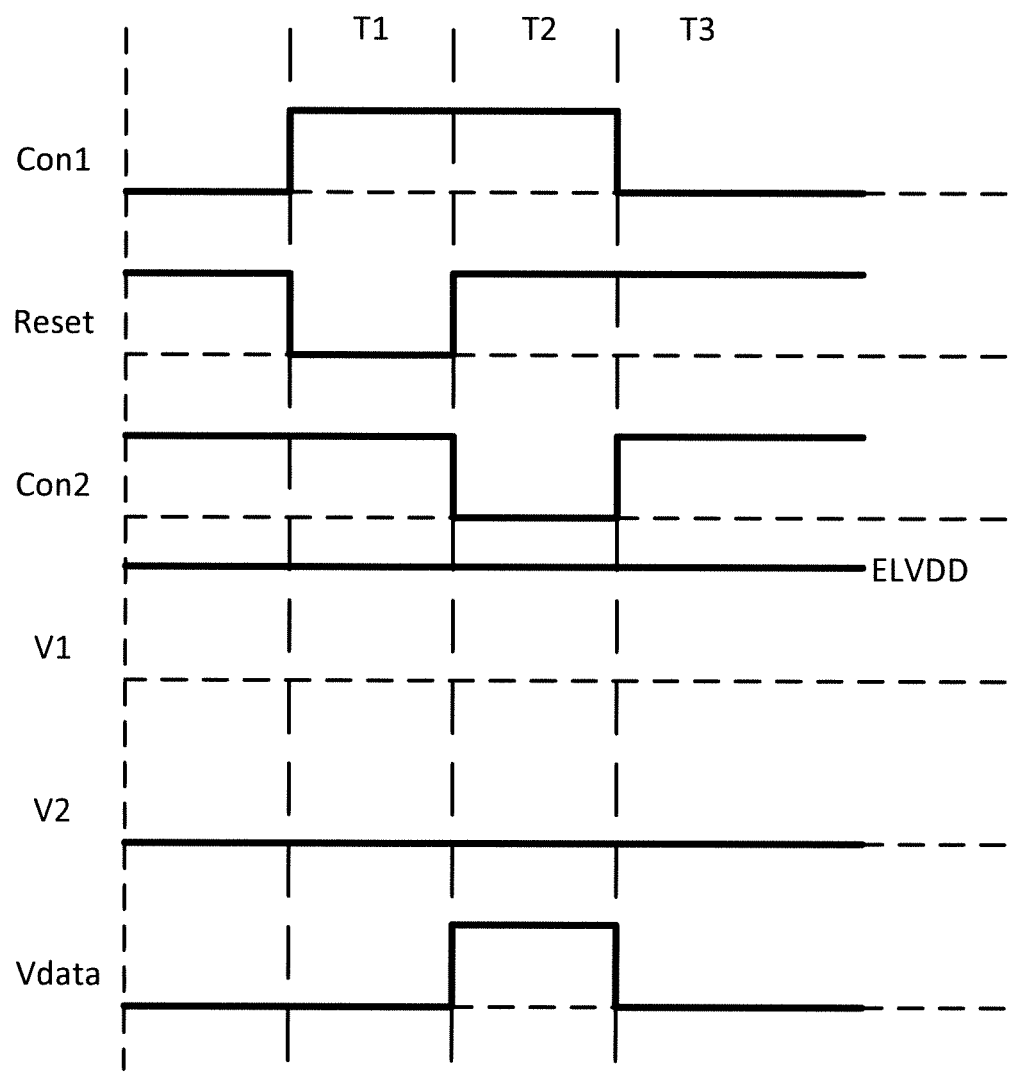
FIG. 3A illustrates a signal timing diagram of the pixel driving circuit of FIG. 2.

FIG. 3A illustrates a signal timing diagram of the pixel driving circuit of FIG. 2.

Specifically, as shown in FIG. 3A, in a first phase T1, a first control signal Con1 and a second control signal Con2 having a first level (i.e., a high level) are provided, and a reset signal Reset having a second level (i.e., a low level) is provided.

Figure 3B:
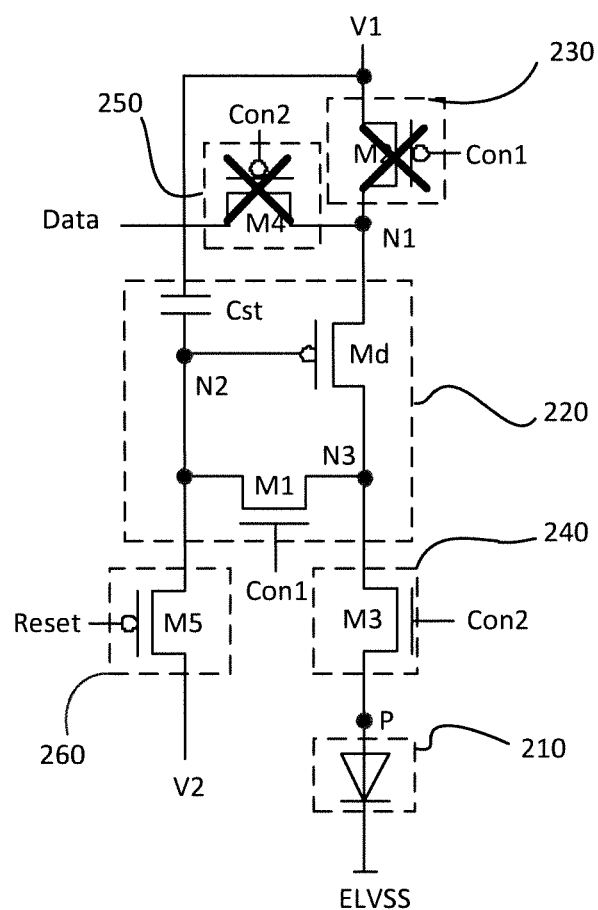
FIGS. 3B, 3C, and 3D illustrate schematic diagrams of the pixel driving circuit of FIG. 2 in various phases.

Therefore, in the first phase T1, under control of the first control signal Con1, the first transistor M1 is turned on, and the second transistor M2 is turned off; under control of the second control signal Con2, the third transistor M3 is turned on, and the fourth transistor M4 is turned off; and under control of the reset signal Reset, the fifth transistor M5 is turned on. A schematic diagram of the pixel driving circuit at this time is shown in FIG. 3B. It should be illustrated that a transistor which is turned off in this phase is marked by a diagonal cross "x" in FIG. 3B.

In a case where the first transistor M1, the third transistor M3, and the fifth transistor M5 are turned on, the second voltage V2 at a low level is transmitted to the second node N2 and the third node N3, so that the gate of the driving transistor Md becomes a low level, which may cause the driving transistor Md to be turned on. The anode of the light-emitting element 110 also becomes a low level. Thereby, the gate of the driving transistor Md and the output terminal P of the pixel driving circuit (and thus an anode of the light-emitting element 310) are both reset to the second level V2. Therefore, the first phase T1 is also referred to as a "reset phase."

In a second phase T2, the first control signal Con1 and the reset signal Reset having the first level (i.e., a high level) are provided, and the second control signal Con2 having the second level (i.e., a low level) is provided.

Figure 3C:
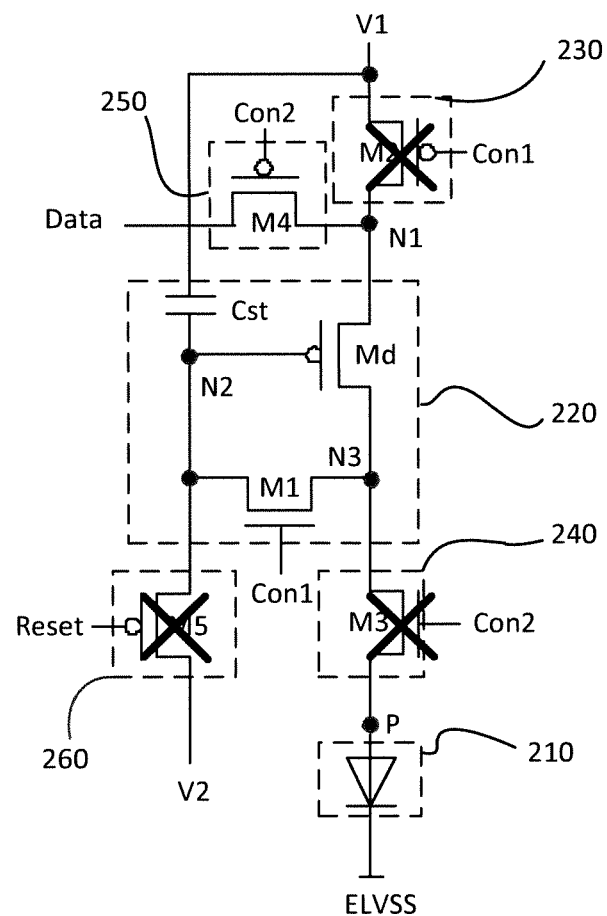

Therefore, in the second phase T2, under control of the first control signal Con1, the first transistor M1 is turned on, and the second transistor M2 is turned off; under control of the second control signal Con2, the third transistor M3 is turned off, and the four transistor M4 is turned on; and under control of the reset signal Reset, the fifth transistor M5 is turned off. A schematic diagram of the pixel driving circuit at this time is shown in FIG. 3C. It should be illustrated that a transistor which is turned off in this phase is marked by a diagonal cross "x" in FIG. 3C.

In a case where the fourth transistor M4 is turned on, the voltage of the data signal Data is input to the first node N1. Since the second node N2 is at a low level (the second voltage V2) in the previous phase, the second node N2 is maintained at a low level due to the presence of the storage capacitor Cst, so that the driving transistor Md is still in a turn-on state, and thereby the data signal Data at a high level is continuously transmitted to the third node N3. In a case where the first transistor M1 is turned on, the voltage (data voltage Vdata) of the data signal Data is continuously transmitted to the second node N2 to charge the second node N2 which is located at a low level. As the voltage at the second node N2 continuously rises, a gate-source voltage Vgs of the driving transistor Md gradually increases from V2−Vdata until Vgs=−Vth, wherein Vth is a threshold voltage of the driving transistor Md. At this time, the driving transistor Md is no longer turned on, and the charging of the second node N2 is stopped. At this time, the voltage at the second node N2 (i.e., the gate of the driving transistor Md) is Vg=Vgs+Vs=Vdata−Vth. The data voltage Vdata has been written into the second node N2. Therefore, this second phase T2 may also be referred to as a "data voltage writing phase." In some embodiments, the data voltage Vdata may be a positive voltage within a predetermined range.

In a third phase T3, the second control signal Con2 and the reset signal Reset having the first level (i.e., a high level) are provided, and the first control signal Con1 having the second level (i.e., a low level) is provided.

Figure 3D:
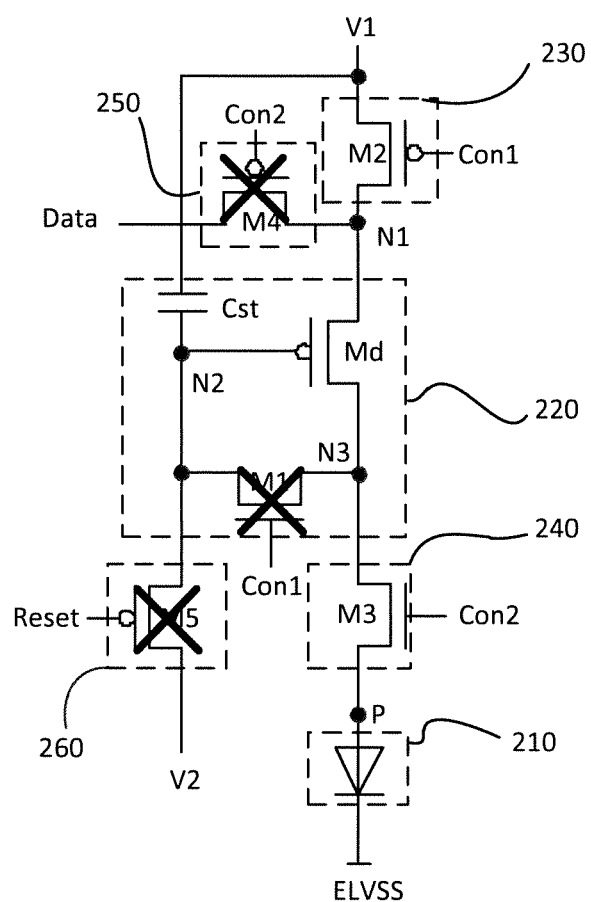

Therefore, in the third phase T3, under control of the first control signal Con1, the first transistor M1 is turned off, and the second transistor M2 is turned on; under control of the second control signal Con2, the third transistor M3 is turned on, and the fourth transistor M4 is turned off; and under control of the reset signal Reset, the fifth transistor M5 is turned off. A schematic diagram of the pixel driving circuit at this time is shown in FIG. 3D. It should be illustrated that a transistor which is turned off in this phase is marked by a diagonal cross "x" in FIG. 3D.

In a case where the second transistor M2 is turned on, the first voltage V1 (i.e., the power supply voltage ELVDD) is transmitted to the first node N1, that is, Vs=ELVDD, wherein Vs is a voltage at the source of the driving transistor Md. At this time, since both the first transistor M1 and the fifth transistor M5 are turned off, the voltage at the second node N2 is maintained at Vdata−Vth, that is, Vg=Vdata−Vth, wherein Vg is the voltage at the gate of the driving transistor Md, and thus, Vgs=Vdata−Vth−ELVDD, wherein Vgs is less than −Vth, so that the driving transistor Md is turned on. In a case where the third transistor M3 is turned on, the driving current Id generated by the driving transistor Md is applied to the anode of the light-emitting unit 310, to drive the light-emitting unit to emit light. Therefore, the third phase T3 is also referred to as a "light-emitting phase."

Specifically, an expression of the driving current Id is:

$$Id = K(Vsg - Vth)^2$$
$$= K(Vth + ELVDD - Vdata - Vth)^2$$
$$= K(ELVDD - Vdata)^2$$

where K is a current constant associated with the driving transistor Md, which is related to process parameters and geometric dimensions of the driving transistor Md. It may be seen from the above formula that the driving current Id for driving the light-emitting element 110 to emit light is independent of the threshold voltage Vth of the driving transistor Md, so that the phenomenon of non-uniform brightness of the light-emitting element due to the shift of the threshold voltage Vth of the driving transistor Md may be eliminated.

Figure 4:
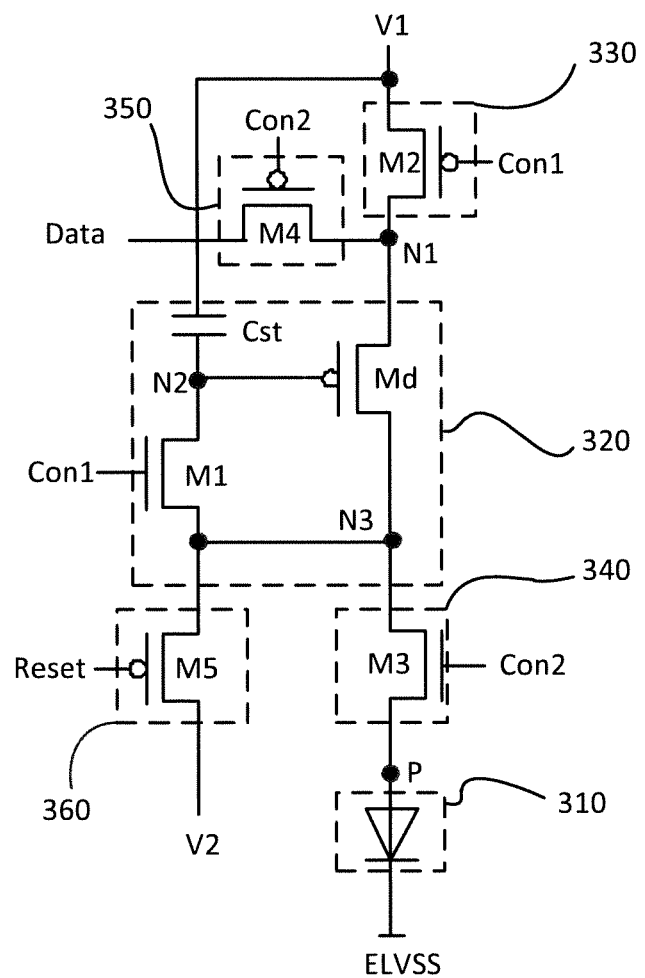
FIG. 4 illustrates a circuit diagram of a pixel driving circuit according to another embodiment of the present disclosure.

FIG. 4 illustrates a circuit diagram of a pixel driving circuit according to another embodiment of the present disclosure. The pixel driving circuit shown in FIG. 4 is similar to the pixel driving circuit shown in FIG. 2 except for connection of the reset sub-circuit 360. For the sake of brevity, differences between the pixel driving circuit shown in FIG. 4 and the pixel driving circuit shown in FIG. 2 will be mainly described in detail below.

As shown in FIG. 4, the pixel driving circuit of FIG. 4 comprises a driving sub-circuit 320, a first light-emitting control sub-circuit 330, a second light-emitting control sub-circuit 340, a driving control sub-circuit 350, and a reset sub-circuit 360. An output terminal of the pixel driving circuit is connected to a light-emitting element 310 to drive the light-emitting element 310 to emit light. As shown in FIG. 4, the driving sub-circuit 320, the first light-emitting control sub-circuit circuit 330, the second light-emitting control sub-circuit 340, the driving control sub-circuit 350, and the reset sub-circuit 360 may be implemented using the driving sub-circuit 220, the first light-emitting sub-circuit 230, the second light-emitting control sub-circuit 240, the driving control sub-circuit 250, and the reset sub-circuit 260 described above respectively, and the light-emitting element 310 may be implemented using the light-emitting element 210 described above.

In FIG. 4, the reset sub-circuit 360 comprises a fifth transistor M5. The fifth transistor M5 has a gate configured to receive the reset signal Reset, a first electrode connected to the second voltage line to receive the second voltage V2, and a second electrode connected to the third node N3 (instead of the second node N2 in FIG. 2).

Further, the type of the fifth transistor M5 is the same as the type of the driving transistor Md. In the present exemplary embodiment, the fifth transistor M5 is a P-type transistor.

The above description in conjunction with FIG. 2 is equally applicable to the same parts of the pixel driving circuit in FIG. 4 as those in FIG. 2, and will not be described in detail herein.

Figure 5A:
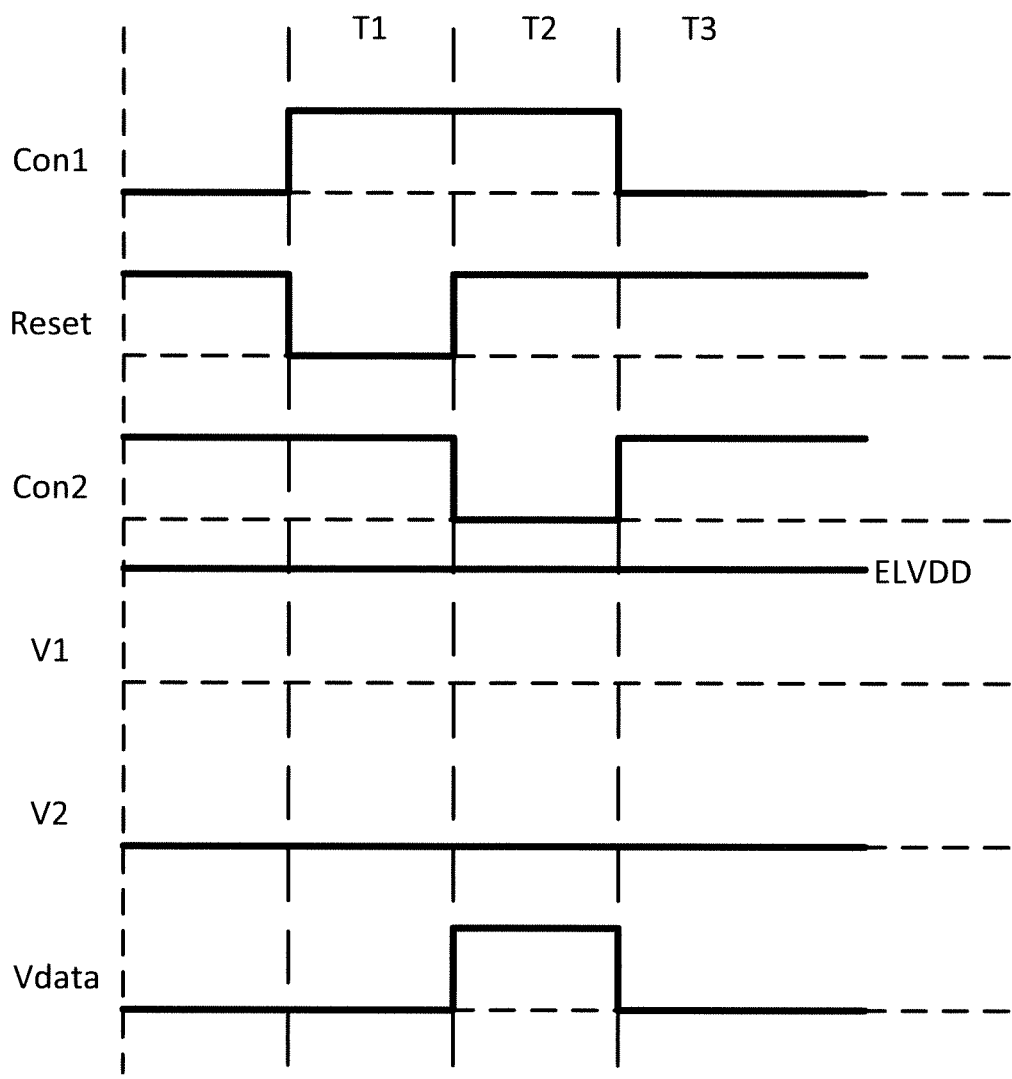
FIG. 5A illustrates a signal timing diagram of the pixel driving circuit of FIG. 4.

FIG. 5A illustrates a signal timing diagram of the pixel driving circuit of FIG. 4.

Specifically, as shown in FIG. 5A, in a first phase T1, a first control signal Con1 and a second control signal Con2 having a first level (i.e., a high level) are provided, and a reset signal Reset having a second level (i.e., a low level) is provided.

Figure 5B:
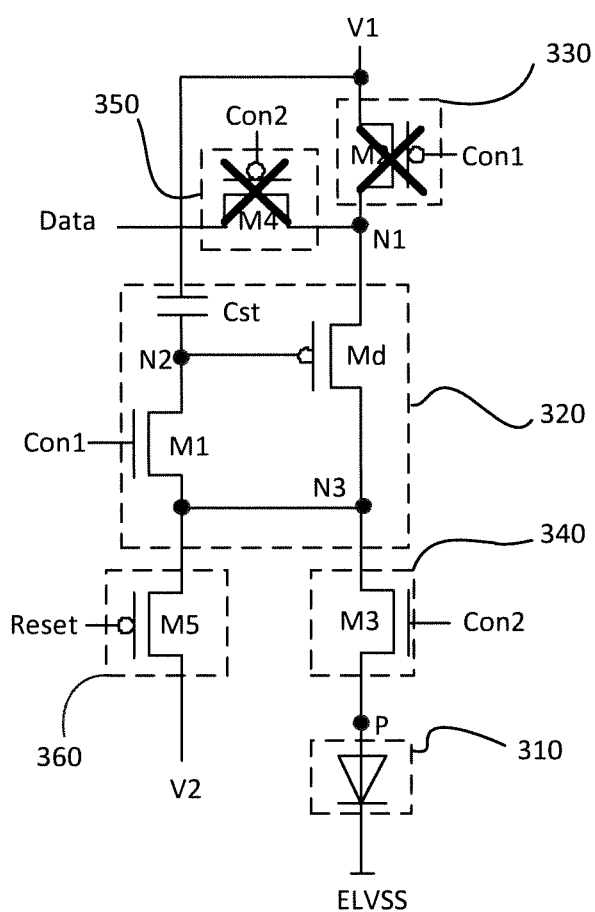
FIGS. 5B, 5C, and 5D illustrate schematic diagrams of the pixel driving circuit of FIG. 4 in various phases.

Therefore, in the first phase T1, under control of the first control signal Con1, the first transistor M1 is turned on, and the second transistor M2 is turned off; under control of the second control signal Con2, the third transistor M3 is turned on, and the fourth transistor M4 is turned off; and under control of the reset signal Reset, the fifth transistor M5 is turned on. A schematic diagram of the pixel driving circuit at this time is shown in FIG. 5B. It should be illustrated that a transistor which is turned off in this phase is marked by a diagonal cross "x" in FIG. 5B.

In a case where the first transistor M1, the third transistor M3, and the fifth transistor M5 are turned on, the second voltage V2 at a low level is transmitted to the second node N2 and the third node N3, so that the gate of the driving transistor Md becomes a low level, which may cause the driving transistor Md to be turned on. Thereby, the gate of the driving transistor Md and the output terminal P of the pixel driving circuit are both reset to the second level V2. The anode of the light-emitting element 110 is also reset to the second voltage V2.

In a second phase T2, the first control signal Con1 and the reset signal Reset having the first level (i.e., a high level) are provided, and the second control signal Con2 having the second level (i.e., a low level) is provided.

Figure 5C:
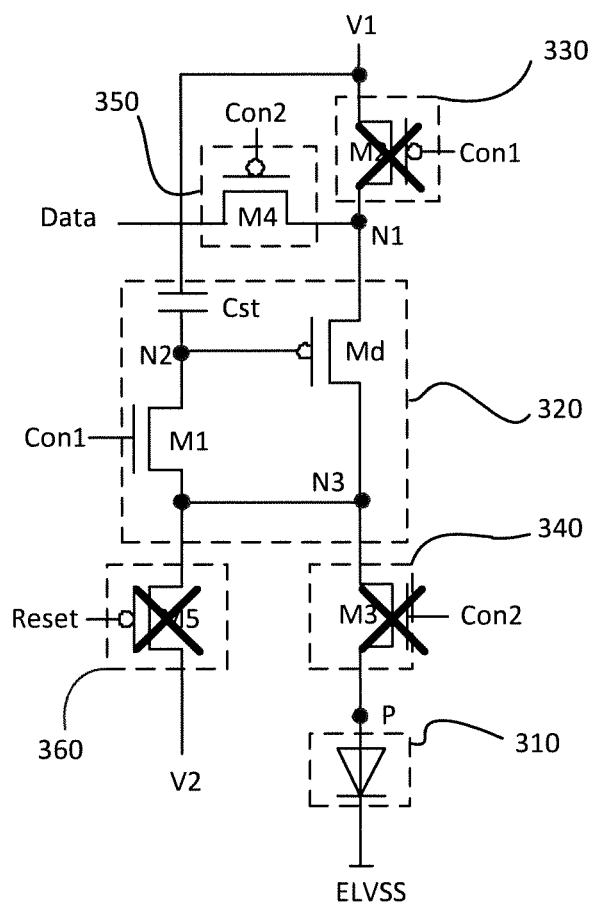

Therefore, in the second phase T2, under control of the first control signal Con1, the first transistor M1 is turned on, and the second transistor M2 is turned off; under control of the second control signal Con2, the third transistor M3 is turned off, and the four transistor M4 is turned on; and under control of the reset signal Reset, the fifth transistor M5 is turned off. A schematic diagram of the pixel driving circuit at this time is shown in FIG. 5C. It should be illustrated that a transistor which is turned off in this phase is marked by a diagonal cross "x" in FIG. 5C.

In a case where the fourth transistor M4 is turned on, the voltage of the data signal Data is written into the first node N1. The second node N2 is still at a low level due to the presence of the storage capacitor Cst, and at this time, the driving transistor Md is still in a turn-on state, and thereby the voltage of the data signal Data is continuously transmitted to the third node N3. In a case where the first transistor M1 is turned on, the voltage (data voltage Vdata) of the data signal Data is continuously transmitted to the second node N2 to charge the second node N2 which is located at a low level. As the voltage at the second node N2 continuously rises, a gate-source voltage Vgs of the driving transistor Md gradually increases from V2−Vdata until Vgs=−Vth, wherein Vth is a threshold voltage of the driving transistor Md. At this time, the driving transistor Md is no longer turned on, and the charging of the second node N2 is stopped. At this time, the voltage at the second node N2 (i.e., the gate of Md) is Vg=Vgs+Vs=Vdata−Vth. The data voltage Vdata has been written into the second node N2. Therefore, this second phase T2 may also be referred to as a "data voltage writing phase." In some embodiments, Vdata may have the first level (i.e., a high level).

In a third phase T3, the second control signal Con2 and the reset signal Reset having the first level (i.e., a high level) are provided, and the first control signal Con1 having the second level (i.e., a low level) is provided.

Figure 5D:
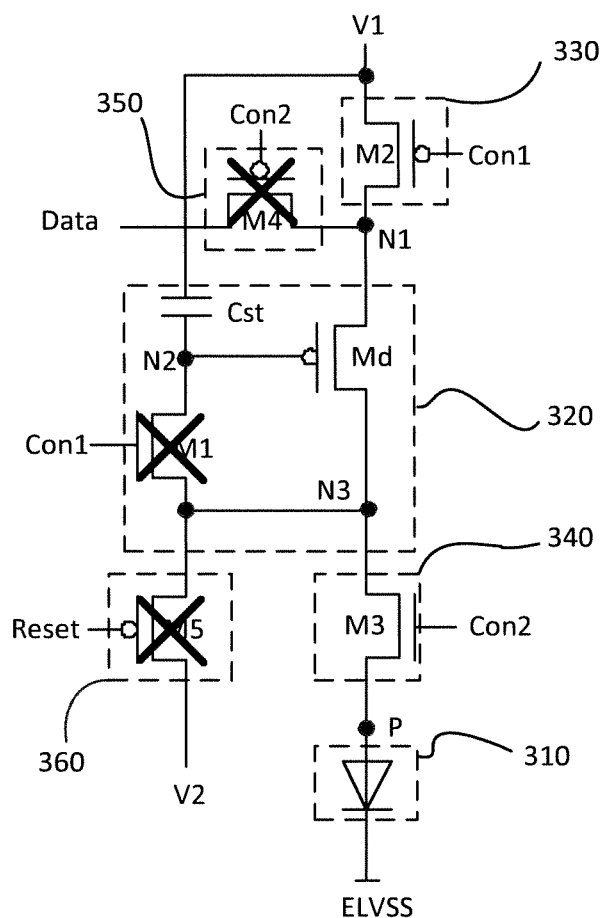

Therefore, in the third phase T3, under control of the first control signal Con1, the first transistor M1 is turned off, and the second transistor M2 is turned on; under control of the second control signal Con2, the third transistor M3 is turned on, and the fourth transistor M4 is turned off; and under control of the reset signal Reset, the fifth transistor M5 is turned off. A schematic diagram of the pixel driving circuit at this time is shown in FIG. 5D. It should be illustrated that a transistor which is turned off in this phase is marked by a diagonal cross "x" in FIG. 5D.

In a case where the second transistor M2 is turned on, the first voltage V1 (i.e., the power supply voltage ELVDD) is transmitted to the first node N1, that is, Vs=ELVDD, wherein Vs is a voltage at the source of the driving transistor Md. At this time, since both the first transistor M1 and the fifth transistor M5 are turned off, the voltage at the second node N2 is maintained at Vdata−Vth, that is, the voltage at the gate of the driving transistor Md is Vg=Vdata−Vth, and thus, Vgs=Vdata−Vth−ELVDD, wherein Vgs is less than −Vth, so that the driving transistor Md is turned on. In a case where the third transistor M3 is turned on, the driving current Id generated by the driving transistor Md is applied to the anode of the light-emitting element 310, to drive the light-emitting element 310 to emit light. Specifically, an expression of the driving current Id is:

$$Id = K(Vsg - Vth)^2$$
$$= K(Vth + ELVDD - Vdata - Vth)^2$$
$$= K(ELVDD - Vdata)^2$$

where K is a current constant associated with the driving transistor Md, which is related to process parameters and geometric dimensions of the driving transistor Md. It may be seen from the above formula that the driving current Id for driving the light-emitting element 110 to emit light is independent of the threshold voltage Vth of the driving transistor Md, so that the phenomenon of non-uniform brightness of the light-emitting element due to the shift of the threshold voltage Vth of the driving transistor Md may be eliminated.

Figure 6:
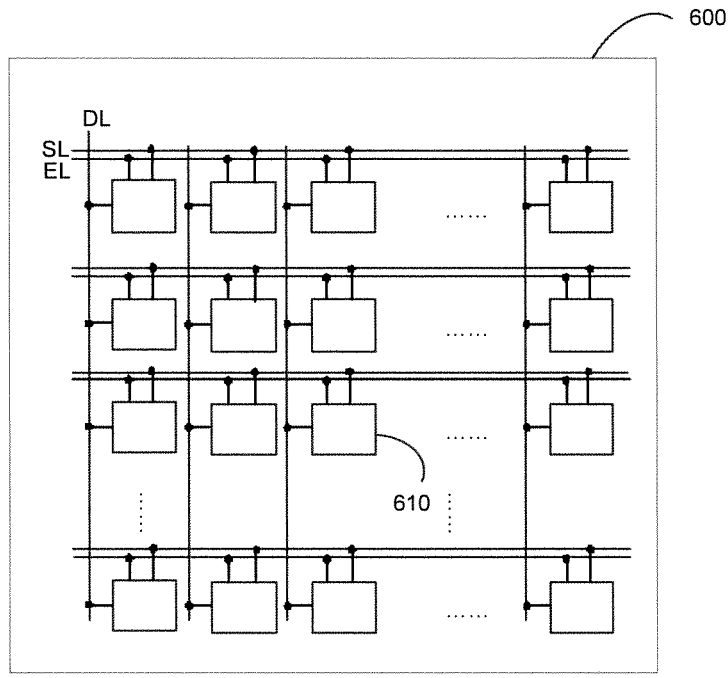
FIG. 6 illustrates a schematic block diagram of a display panel according to an embodiment of the present disclosure.

FIG. 6 illustrates a schematic block diagram of a display panel 600 according to an embodiment of the present disclosure. As shown in FIG. 6, the display panel 600 may comprise a plurality of pixel units 610. Each of the pixel units 610 may be implemented using the pixel unit described above, for example, the pixel unit comprising a light-emitting element and a pixel driving circuit in any of the embodiments described above with reference to FIGS. 1, 2, and 4. The display panel 600 further comprises a plurality of scanning lines SL and a plurality of data lines DL. The plurality of pixel units 610 are arranged in an array, and each of the plurality of data lines DL is connected to a respective column of pixel units 610 in the array to provide a data signal Data to the column of pixel units 610. Each of the plurality of scanning lines SL is connected to a respective row of pixel units 610 in the array to provide a second control signal Con2 to the row of pixel units 610. In some embodiments, the display panel 600 may further comprise a plurality of light-emitting control lines EL, wherein each of the plurality of light-emitting control lines EL is connected to a respective row of pixel units 610 in the array to provide a first control signal Con1 to the row of pixel units 610.

In some embodiments, a reset signal Reset received by each of the pixel units 610 may be provided by a scanning line SL which is previous to a respective scanning line SL of the pixel unit 610 in a scanning order. For example, a reset signal received by an $n^{th}$ row of pixel units is provided by a scanning line connected to an $(n-1)^{th}$ row of pixel units, wherein n is an integer and 2≤n≤N represents a number of rows of pixel units in the array.

It should be understood by those skilled in the art that the "row" and "column" described above are only used to explain a connection relationship among the pixel units, the data lines, the scanning lines and the light-emitting control lines, and may be used interchangeably.

Figure 7:
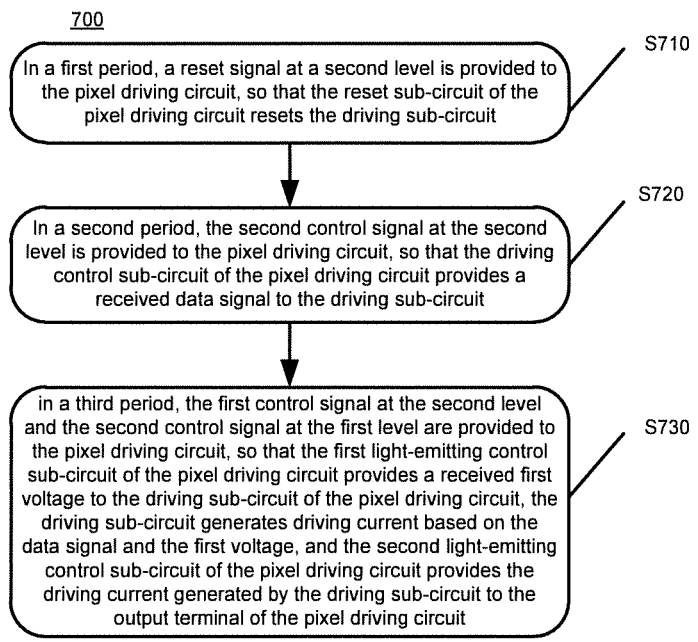
FIG. 7 illustrates a flowchart of a method for driving a pixel driving circuit according to an embodiment of the present disclosure.

FIG. 7 illustrates a flowchart of a method 700 for driving a pixel circuit according to an embodiment of the present disclosure. The method 700 may be used to drive the pixel circuit 100 shown in FIG. 1, 2 or 4.

As shown in FIG. 7, in step S710, in a first period, a reset signal at a second level is provided to the pixel driving circuit, so that the reset sub-circuit of the pixel driving circuit resets the driving sub-circuit. By taking the pixel driving circuit of FIG. 2 as an example, a first control signal and a second control signal having a first level may be provided, and the reset signal having the second level may be provided.

In step S720, in a second period, the second control signal at the second level is provided to the pixel driving circuit, so that the driving control sub-circuit of the pixel driving circuit provides a received data signal to the driving sub-circuit. Also by taking the pixel driving circuit of FIG. 2 as an example, the first control signal and the reset signal having the first level are provided, and the second control signal having the second level is provided.

In step S730, in a third period, the first control signal at the second level and the second control signal at the first level are provided to the pixel driving circuit, so that the first light-emitting control sub-circuit of the pixel driving circuit provides a received first voltage to the driving sub-circuit of the pixel driving circuit, the driving sub-circuit generates driving current based on the data signal and the first voltage, and the second light-emitting control sub-circuit of the pixel driving circuit provides the driving current generated by the driving sub-circuit to the output terminal of the pixel driving circuit. Also by taking the pixel driving circuit of FIG. 2 as an example, the second control signal and the reset signal having the first level are provided, and the first control signal having the second level is provided.

Here, for the driving transistor, the first level may be an inactive level of the driving transistor, and the second level may be an active level. For example, in the pixel driving circuit described above with reference to FIGS. 2 and 4, the first transistor M1 and the third transistor M3 are N-type transistors, the driving transistor Md, the second transistor M2, the fourth transistor M4, and the fifth transistor M5 are P-type transistors, the first level is a high level, and the second level is a low level.

The driving processes of the method 700 in different embodiments have been described above with reference to FIGS. 2 and 4, and will not be described herein again.

The foregoing detailed description has set forth various embodiments via the use of diagrams, flowcharts, and/or examples. In a case where such diagrams, flowcharts, and/or examples contain one or more functions and/or operations, it should be understood by those skilled in the art that each function and/or operation within such diagrams, flowcharts or examples may be implemented, individually and/or collectively, by a wide range of structures, hardware, software, firmware, or virtually any combination thereof.

Although the present disclosure has been described with reference to a few exemplary embodiments, it should be understood that the terms used are illustrative and exemplary and not restrictive. Since the present disclosure may be embodied in a variety of forms without departing from the spirit or scope of the present disclosure, it should be understood that the above-described embodiments are not limited to any details described above, but are construed broadly within the spirit and scope defined by the appended claims. Therefore, all changes and modifications which fall within the scope of the claims or the equivalents thereof are intended to be covered by the appended claims.

We claim:

1. A pixel driving circuit, comprising:
   a driving sub-circuit, configured to generate driving current based on a data signal and a first voltage;
   a first light-emitting control sub-circuit configured to receive a first control signal and the first voltage, and provide the first voltage to the driving sub-circuit under control of the first control signal;

a second light-emitting control sub-circuit configured to receive a second control signal and provide driving current generated by the driving sub-circuit to an output terminal of the pixel driving circuit under control of the second control signal;

a driving control sub-circuit configured to receive the second control signal and the data signal and provide the data signal to the driving sub-circuit under control of the second control signal; and a reset sub-circuit configured to receive a reset signal and a second voltage, and reset the driving sub-circuit using the second voltage under control of the reset signal.

2. The pixel driving circuit according to claim 1, wherein the driving sub-circuit comprises a driving transistor, a first transistor, and a storage capacitor, wherein the driving transistor has a gate connected to the storage capacitor at a second node, a first electrode connected to the first light-emitting control sub-circuit and the driving control sub-circuit at a first node, and a second electrode connected to the second light-emitting control sub-circuit and the reset sub-circuit at a third node, the first transistor has a gate connected to receive the first control signal, a first electrode connected to the second node, and a second electrode connected to the third node; and the storage capacitor has a first terminal connected to a first voltage line for providing the first voltage, and a second terminal connected to the second node.

3. The pixel driving circuit according to claim 2, wherein the first transistor is an N-type transistor, and the driving transistor is a P-type transistor.

4. The pixel driving circuit according to claim 2, wherein the first light-emitting control sub-circuit comprises a second transistor having a gate connected to receive the first control signal, a first electrode connected to the first voltage line, and a second electrode connected to the first node.

5. The pixel driving circuit according to claim 4, wherein the second transistor is a P-type transistor.

6. The pixel driving circuit according to claim 4, wherein the second light-emitting control sub-circuit comprises a third transistor having a gate connected to receive the second control signal, a first electrode connected to the third node, and a second electrode connected to the output terminal.

7. The pixel driving circuit according to claim 6, wherein the third transistor is an N-type transistor.

8. The pixel driving circuit according to claim 6, wherein the driving control sub-circuit comprises a fourth transistor having a gate connected to receive the second control signal, a first electrode connected to a data signal terminal for providing the data signal, and a second electrode connected to the first node.

9. The pixel driving circuit according to claim 8, wherein the fourth transistor is a P-type transistor.

10. The pixel driving circuit according to claim 8, wherein the reset sub-circuit comprises a fifth transistor having a gate connected to receive the reset signal, a first electrode connected to a second voltage line for providing the second voltage, and a second electrode connected to the third node.

11. The pixel driving circuit according to claim 10, wherein the fifth transistor is a P-type transistor.

12. The pixel driving circuit according to claim 8, wherein the reset sub-circuit comprises a fifth transistor having a gate connected to receive the reset signal, a first electrode connected to a second voltage line for providing the second voltage, and a second electrode connected to the second node.

13. The pixel driving circuit according to claim 12, wherein the fifth transistor is a P-type transistor.

14. A pixel unit, comprising:
the pixel driving circuit according to claim 1; and
a light-emitting element having an input terminal connected to the output terminal of the pixel driving circuit.

15. A display panel, comprising a plurality of pixel units according to claim 13.

16. The display panel according to claim 15, wherein the plurality of pixel units are arranged in an array, the display panel further comprising:

a plurality of scanning lines, wherein each of the plurality of scanning lines is connected to a respective row of pixel units in the array to provide the second control signal to the row of pixel units;

a plurality of data lines, wherein each of the plurality of data lines is connected to a respective column of pixel units in the array to provide a data signal to the column of pixel units; and a plurality of light-emitting control lines, wherein each of the plurality of light-emitting control lines is connected to a respective row of pixel units in the array to provide the first control signal to the row of pixel units.

17. The display panel according to claim 16, wherein a reset signal received by an $n^{th}$ row of pixel units is provided by a scanning line connected to an $(n-1)^{th}$ row of pixel units, wherein n is an integer and $2 \leq n \leq N$, and N represents a number of rows of pixel units in the array.

18. A method for driving a pixel driving circuit, wherein the pixel driving circuit comprises:

a driving sub-circuit, configured to generate driving current based on a data signal and a first voltage;

a first light-emitting control sub-circuit configured to receive a first control signal and the first voltage, and provide the first voltage to the driving sub-circuit under control of the first control signal;

a second light-emitting control sub-circuit configured to receive a second control signal and provide driving current generated by the driving sub-circuit to an output terminal of the pixel driving circuit under control of the second control signal;

a driving control sub-circuit configured to receive the second control signal and the data signal and provide the data signal to the driving sub-circuit under control of the second control signal; and a reset sub-circuit configured to receive a reset signal and a second voltage, and reset the driving sub-circuit using the second voltage under control of the reset signal, the method comprising:

providing, in a first period, the reset signal at a second level to the pixel driving circuit, so that the reset sub-circuit of the pixel driving circuit resets the driving sub-circuit;

providing, in a second period, the second control signal at the second level to the pixel driving circuit, so that the driving control sub-circuit of the pixel driving circuit provides a received data signal to the driving sub-circuit; and providing, in a third period, the first control signal at the second level and the second control signal at a first level to the pixel driving circuit, so that the first light-emitting control sub-circuit of the pixel driving circuit provides a received first voltage to the driving sub-circuit of the pixel driving circuit, the driving sub-circuit generates driving current based on the data signal and the first voltage, and the second light-emitting control sub-circuit of the pixel driving circuit provides the driving current generated by the driving sub-circuit to the output terminal of the pixel driving circuit.

19. The method according to claim 18, wherein the driving sub-circuit comprises a driving transistor, a first transistor, and a storage capacitor, wherein the first light-emitting control sub-circuit comprises a second transistor, the second light-emitting control sub-circuit comprises a third transistor, the driving control sub-circuit comprises a fourth transistor, and the reset sub-circuit comprises a fifth transistor, wherein
- in the first period, the first control signal and the second control signal having the first level are provided, and the reset signal having the second level is provided;
- in the second period, the first control signal and the reset signal having the first level are provided, and the second control signal having the second level is provided; and
- in the third period, the second control signal and the reset signal having the first level are provided, and the first control signal having the second level is provided.

20. The method according to claim 19, wherein the first transistor and the third transistor are N-type transistors, the driving transistor, the second transistor, the fourth transistor, and the fifth transistor are P-type transistors, the first level is a high level and the second level is a low level.

* * * * *